United States Patent
Huang et al.

(10) Patent No.: US 6,384,705 B1
(45) Date of Patent: May 7, 2002

(54) MULTILAYER-TYPE CHIP COMMON MODE FILTER

(75) Inventors: Yu-Ting Huang; Wen-Song Ko; Mean-Jue Tung; Hong-Ching Lin; Li-Jiun Wang, all of Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/476,432

(22) Filed: Dec. 30, 1999

(51) Int. Cl.$^7$ ................................................. H01F 5/00
(52) U.S. Cl. ......................................... 336/200; 336/83
(58) Field of Search .......................... 336/65, 83, 192, 336/200, 223, 232; 29/602.1

(56) References Cited

FOREIGN PATENT DOCUMENTS

| JP | 2-135715 | * | 5/1990 |
| JP | 4-364010 | * | 12/1992 |
| JP | 5-283232 | * | 10/1993 |

* cited by examiner

Primary Examiner—Lincoln Donovan
Assistant Examiner—Tuyen T. Nguyen
(74) Attorney, Agent, or Firm—W. Wayne Liauh

(57) ABSTRACT

A miniaturized common mode EMI filter with a greatly simplified design so that it can be manufactured very economically. The common mode filter includes: (a) a magnetic main body; (b) a pair of substantially identical electrically conductive planar coils embedded in the magnetic main body; and (c) an insulative planar coil sandwiched between the pair of electrically conductive planar coils, wherein the insulative planar coil has a pattern that is substantially identical to and inclusive of the pattern of the electrically conductive planar coils so as to insulate the pair of electrically conductive planar coil from each other. The common mode filter retains low normal mode impedance and high common mode impedance, with a substantially reduced physical size, so that it can cost-effectively maintain a high fidelity of the normal mode waveform of signals for electronic devices that utilize differential transmission technology and keep the common mode EMI noise to a minimum.

12 Claims, 4 Drawing Sheets

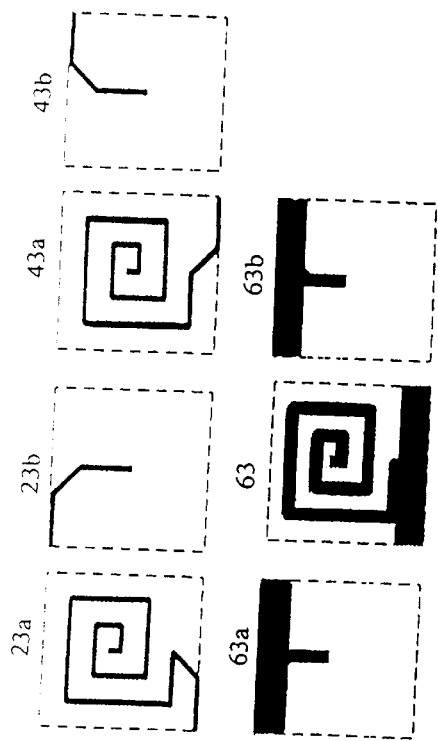
Fig. 6
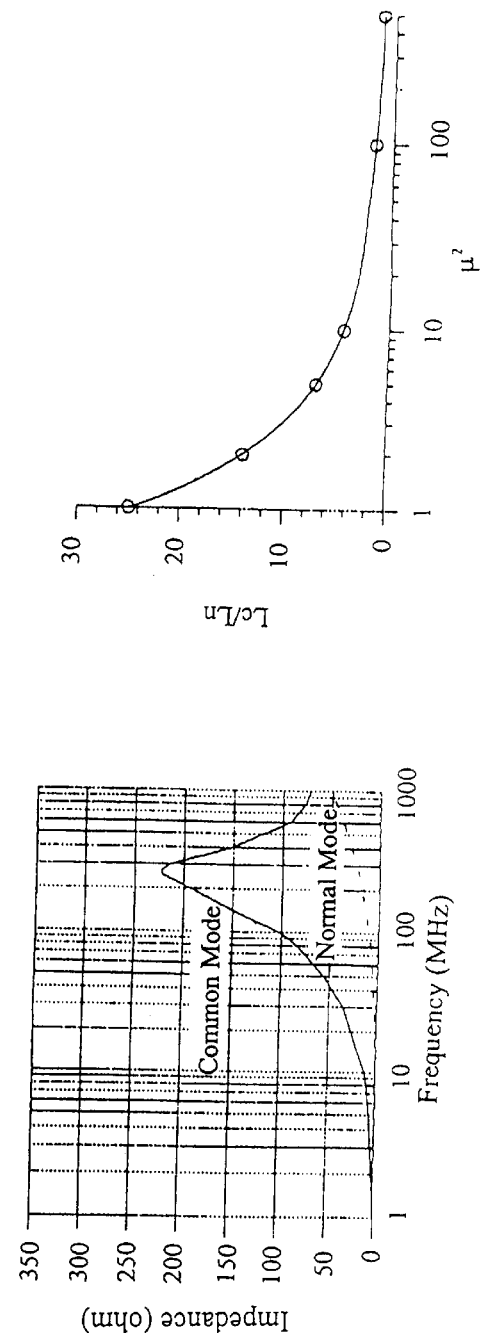
Fig. 9
Fig. 10

MULTILAYER-TYPE CHIP COMMON MODE FILTER

FIELD OF THE INVENTION

The present invention relates to a chip-type common mode filter. More specifically, the present invention relates to miniaturized chip-type common mode EMI filters with a novel design so that they can be manufactured very economically with substantially reduced physical dimension, while maintaining high common mode impedance, low normal mode impedance, so as to maintain a high fidelity of normal mode waveforms and minimize common mode noises for devices that utilize differential transmission technology, The common mode filter developed in the present invention is most advantageous for the manufacturing of the so-called "low profile" electronic devices such as notebook and handheld computers or other portable consumer electronic goods. The present invention also relates to the method of making the novel chip-type common mode filter.

BACKGROUND OF THE INVENTION

It is well known that electronic instruments produce electromagnetic interference (EMI), which can interfere with the operation of other electronic instruments. Conventionally, EMI is modeled as two superposed current components: common mode current and differential mode current. By definition, differential mode currents travel in opposite directions on a pair (or multiplicity) of conductors. And common mode currents are defined as traveling in the same direction on a pair (or multiplicity) of conductors. Differential-mode noise travels in the same direction as the desired signal. In contrast, common mode noise is expressed as a displacement with respect to a reference potential on both (or a multiplicity of) conductors at the instrument location. If the instrument in question measures its signals with respect to a ground potential, common mode noise may corrupt its measurement of the desired signal. Rejection of all common-mode currents, i.e., noise, is desired.

The need to remove common mode EMI becomes more imperative in light of today's rapid development in internet communication and digital data transmission devices which involve constantly increasing data transfer rates. Another problem facing the industry today is the wide use of the differential transmission technique in various devices, such the universal serial bus (USB), IEEE 1394 interface standard, low-voltage differential signaling (LVDS), etc. Because differential transmission involves pairs of transmission lines, so as to provide good a return route for each signal, the EMI noises are primarily common mode noises. The frequency interval of the EMI noises often overlaps with the frequency interval of the signals themselves. This makes it difficult for the conventional EMI filters to effectively reduce the common mode EMI noise without adversely affecting the quality, and/or fidelity, of the normal mode portion of the differential transmission signals.

To satisfy this need, as well as to accommodate the decreased size of today's electronic circuits, a number of common mode choke coils have been developed which are formed by winding two conductors on a ring-shaped magnetic core or bar-shaped magnetic core the same number of turns in the same direction. U.S. Pat. No. 5,552,756, the content thereof is incorporated herein by reference, discloses a chip type common mode choke coil which is, compared to previous filters, relatively simple in structure, suitable for miniaturization, high in mass productivity, and high in economization. The common mode choke coil contains a plurality of non-magnetic sheets on which a plurality of double-loop conductor lines (or coils which bend at approximately a right angle) are formed, respectively. A pair of magnetic layers are formed above and below the upper and lower surfaces, respectively, of the plurality of the non-magnetic sheets. Finally, a pair of magnetic cores are arranged substantially at the centers of the loops of the conductor coils so as to form a closed magnetic path.

The common mode choke coil disclosed in the '756 patent made the first step towards the miniaturization of common mode filters. However, because it requires the placement of the multiple sheets in order to provide the alternately connected double-loop conductor coils and the pair of magnetic cores, the manufacturing process is still not simple enough, and the structure not compact enough. As a result, its manufacturing cost may not satisfy the expectation of today's consumers. Furthermore, it may not be compact enough.

SUMMARY OF THE INVENTION

The primary object of the present invention is to develop an improved common mode filter with substantially reduced size, simplified construction, low normal mode impedance (Zn) and high common mode impedance (Zc). More specifically, the primary object of the present invention is to develop an improved and miniaturized common mode EMI filter with a greatly simplified design so that it can be manufactured very economically, while retaining low normal mode impedance and high common mode impedance, and with a substantially reduced physical size, so that it can cost-effectively maintain a high fidelity of the normal mode waveform of signals for electronic devices that utilize differential transmission technology and keep the common mode EMI noise to a minimum. The common mode filter of the present invention, which contains a pair of planar coils embedded in a magnetic substrate with excellent coupling and well balanced electric inductance, is most advantageous for use in making notebook and handheld computers, as well as other portable electronic devices.

The chip-type common mode filter disclosed in the present invention contains a magnetic main body and a pair of substantially identical electrically conducting planar coils embedded in the magnetic main body. The pair of electrically conducting planar coils are intimately (i.e., touching each other) separated by a substantially identical insulative planar coil, which is also embedded in the magnetic main body. More specifically, the chip-type common mode filter disclosed in the present invention contains the following elements:

(a) a magnetic main body;

(b) a pair of substantially identical electrically conductive planar coils embedded in the magnetic main body; and (c) an insulative planar coil sandwiched between the pair of electrically conductive planar coils, wherein the insulative planar coil has a pattern that is substantially identical to and inclusive of the pattern of the electrically conductive planar coils so as to insulate the electrically conductive planar coil from each other.

In order to effectively insulate the electrically conductive planar coil from each other, the insulative planar coil should preferably have a width that is wider than the width of the electrically conductive planar coil so as to provide effective insulation. Preferably, the electrically conductive planar coils are multi-loop (at least two loops) planar coils having a spiral, serpentine, or meandering pattern. During the process of fabricating the common mode filter of the present invention, the magnetic substrate grows through the void spaces of these loops as well as completely around them. The embedding of the electrically conductive planar coils, which are electrically insulated from each other by the insulative planar coil, allows a close-looped magnetic field to be generated which encompasses the cross-sections of the stacked planar coils and is perpendicular to the direction of the running direction of the stacked (or laminated) planar coils.

The chip-type common mode filter of the present invention also contains four electrical terminals, first input and first output, and second input and second output, all of them are partially embedded in and partially exposed from the magnetic main body for providing electrical connections to the pair of electrically conductive planar coils, respectively. The electrical terminals can be part of the electrically conductive planar coil (i.e., on the same plan), or they can be provided as separate relatively short planar coil segments which are disposed at different plans but are connected to the electrically conductive planar coils, respectively at the inner ends thereof. A similarly shaped insulative planar coil segment is utilized to separate the conductive planar coil from the conductive planar coil segment, except their inner end portions. In this embodiment, the end portions of both the conductive planar coil and the conductive planar coil segment will be pressed against each other by pressure exerted from the magnetic main body during the lamination process, to provide electrical connection.

In another embodiment, two stacks of the coils (i.e., two stacks of conductive-insulative-conductive planar coils) are further stacked on top of each other, but are separated by a partitioning magnetic layer to form serially connected filters. The conductive planar coils in one stack are connected to corresponding conductive planar coils in the second coil stack by conductive vias (i.e., filled conductive holes), respectively, that are formed through the partitioning magnetic layer. These cause two individual common mode filter circuits to be connected in series. Additional filter circuit or circuits can be firther connected to form further multiple common mode circuits.

Preferably, the common mode filter circuit of the present invention is made using a thick film (such as printing) or thin film (such as sputtering) technology. For the thick film process, it can comprise the following steps:

(a) forming a first electrically conductive planar coil on a bottom of a magnetic green sheet, followed by formation of an insulative planar coil and a second substantially identical electrically conductive planar coil sequentially, on top of the first electrically conductive planar coil to form a common mode circuit;

(b) placing a top magnetic green sheet on the second electrically conductive planar coil; and (c) sintering the top and bottom green sheets with the coil stack embedded therein to form a chip-type common mode filter.

If a thin film process is used, the magnetic green sheet is replaced with a magnetic substrate, and the steps of placing the magnetic green sheets is replaced with the step of sputtering top and bottom magnetic films on the substrate. No sintering step is necessary for the thin film process.

The magnetic main body mainly comprises ferrite, which contains $Fe_2O_3$, NiO, CuO, ZnO, $MnO_2$, CoO, etc. The electrically conductive planar coils can be made of a conductive paste or sputtering metal, containing mainly silver, copper, or alloys of silver and palladium. The insulative planar coil can be magnetic or non-magnetic. It can be made of ferrite (i.e., the same material as the material making up the magnetic main body), or a mixture of ferrite and non-magnetically permeating material conducting such as MgO, $SiO_2$, $B_2O_3$, PbO, ZnO, $Al_2O_3$, etc. If the insulative planar coil is made of a mixture of the magnetically permeating material and the non-magnetically permeating material, its magnetic conductivity can be adjusted to vary between 1 and that of the magnetic main body.

BRIEF DESCRIPTION OF THE DRAWING

The present invention will be described in detail with reference to the drawing showing the preferred embodiment of the present invention, wherein:

FIG. 6 is an illustrative perspective layer-by-layer view of the chip-type common mode filter similar to the second preferred embodiment as shown in FIG. 5, except that the bent portions of the conductive coils and coil segments are formed at a slanting angle (45 degrees in this particular case), and the insulative planar coil and coil segments have a widened width at the edge of the filter so as to eliminate the possibility of circuit shorting.

FIG. 9 is a plot of the ratio of common mode impedance over normal mode impedance (Lc/Ln) vs. the magnetic conductivity of the insulative planar coil.

FIG. 10 show plots common mode impedance and normal mode impedance vs. the frequency for the common mode filter of Example 2.

DETAILED DESCRIPTION OF THE PREFERRED EMBODIMENT

The present invention discloses a high-performance and miniaturized common mode EMI filter with a greatly simplified design so that it can be manufactured very economically, while retaining all the desired characteristics of a common mode filter, such as low normal mode impedance and high common mode impedance, so as to be capable of providing a high fidelity of the normal mode waveforms of signals for electronic devices that utilize differential transmission technology and minimize common mode signal noises. The common mode filter of the present invention includes a pair of spaced apart electrically conductive planar coils that are embedded in a magnetic substrate with excellent coupling ratio and well balanced electric inductance, and is most advantageous for use in making notebook and handheld computers, as well as other portable electronic devices.

The chip-type common mode filter disclosed in the present invention can be provided as repeating units connected in series, each individual filter unit contains the following main elements:

(a) a magnetic main body;

(b) a pair of substantially identical electrically conductive planar coils embedded in the magnetic main body; and (c) an insulative planar coil sandwiched between the pair of electrically conductive planar coils, wherein the insulative planar coil has a pattern that is substantially identical to and inclusive of the pattern of the electrically conductive planar coils so as to insulate the pair of electrically conductive planar coil from each other.

In order to effectively insulate the electrically conductive planar coils from each other, the planar coil should preferably have a width that is wider than the width of the electrically conductive planar coil. Preferably, the electrically conductive planar coils are multi-loop planar coils having a spiral, serpentine, or meandering pattern. During the process of fabricating the common mode filter of the present invention, the magnetic substrate grows through the void spaces of these loops as well as around them so as to completely bury the coil stacks, except the input and output terminals. The embedding of the electrically conductive planar coils, which are electrically insulated by the insulative planar coil, allows a closed magnetic loop to be formed which encircles the cross-sections of the stacked planar coils and is perpendicular to the running direction of the planar coils.

Figure 1:
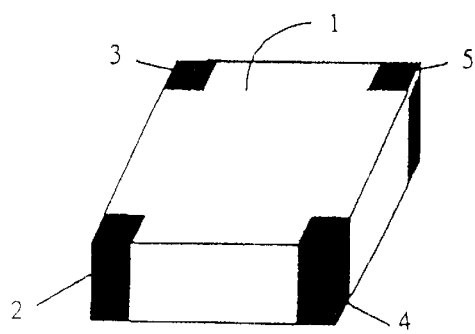
FIG. 1 is an illustrative perspective view of the chip-type common mode EMI filter of the present invention.
Figure 2:
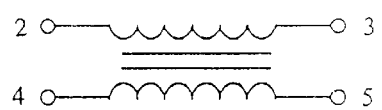
FIG. 2 is an equivalent electric circuit for the chip-type common mode filter as shown in FIG. 1.

FIG. 1 is an illustrative perspective view of the chip-type common mode EMI filter of the present invention. FIG. 2 is an equivalent electric circuit for the chip-type common mode filter as shown in FIG. 1.

The chip-type common mode filter 10 of the present invention also contains four electrical terminals, first input 2 and output 3, and second input 4 and output 5, all of them are partially embedded in and partially exposed from the magnetic main body 1 for providing electrical connections to the pair of electrically conductive planar coils, respectively, which are embodied in the magnetic main body 1. The electrical terminals can be part of the electrically conductive planar coil (i.e., on the same plan), or they can be provided as separate relatively short planar coil segments which are disposed at different plans from, but are connected to, the electrically conductive planar coils, respectively. A similarly shaped insulative planar coil segment is then utilized to separate the conductive planar coil with the conductive planar coil segment, except where the latter two are electrically connected.

Figure 3:
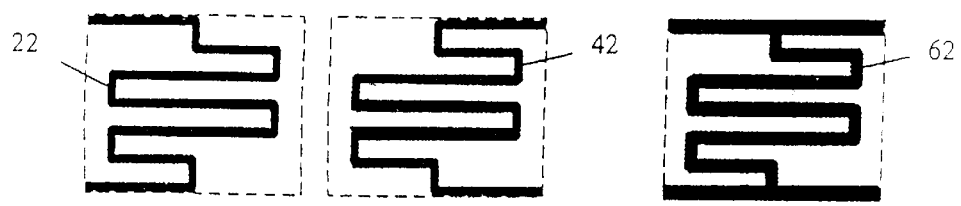
FIG. 3 is an illustrative perspective layer-by-layer view of the chip-type common mode filter circuit according the first preferred embodiment of the present invention.

FIG. 3 is an illustrative perspective layer-by-layer view of the chip-type common mode filter according the first preferred embodiment of the present invention, The common mode filter circuit comprises a first electrically conductive planar coil 22 and a second electrically conductive planar coil 42, separated by an insulative planar coil 62. All the coils have a generally identical meandering multi-loop pattern. As shown in FIG. 3, the insulative planar coil has a width that is greater than the width of the electrically conductive planar coils, and has an a real coverage inclusive of both electrically conductive coils so as to provide complete electrical insulation. This is the simplest form of the common mode filter wherein both the input and output terminals are part of the electrically conductive coils (i.e., on the same respective planes).

Figure 4:
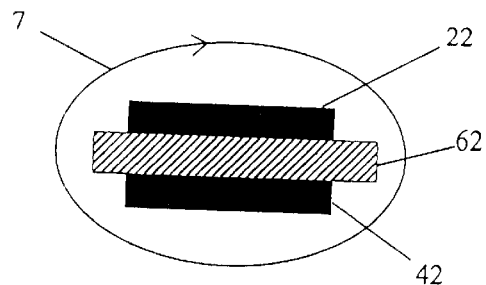
FIG. 4 is an illustrative longitudinal cross-sectional view of the stacked planar coils embedded in the magnetic main body, showing a close-loop magnetic field is generated which is perpendicular to the running direction of the coils.

FIG. 4 is an illustrative longitudinal cross-sectional view of the stacked planar coils (22+62 +42) as shown in FIG. 3, embedded in the magnetic main body, showing a close-looped magnetic field 7. This cross-section can be cut from any point along the common mode filter coil stack.

Preferably, the common mode filter circuit of the present invention is made using a thick film (such as printing) or thin film (such as sputtering) method, and the process comprises the following general steps:

(a) forming a first electrically conductive planar coil on a bottom magnetic green sheet (for thick-film process), or a magnetic substrate (for thin-film process), followed by the formation of an insulative planar coil and a second substantially identical electrically conductive planar coil sequentially on top of the first electrically conductive planar coil to form a common mode circuit;

(b) placing a top magnetic green sheet (for thick-film process), or a top magnetic film (for thin-film process), on the second electrically conductive planar coil; and (c) (for thick-film process only) sintering the top and bottom green sheets with the common mode circuit embedded therein to form a chip-type common mode filter.

The magnetic main body mainly comprises ferrite which contains $Fe_2O_3$, NiO, CuO, ZnO, $MnO_2$, CoO, etc. The electrically conductive planar coils can be made of a conductive paste or sputtering metal, containing mainly silver, copper, or alloys of silver and palladium. The insulative planar coil can be magnetic or non-magnetic. It can be made of ferrite (i.e., the same material as the material making up the magnetic main body), or a mixture of ferrite and non-magnetically permeating material conducting such as MgO, $SiO_2$, $B_2O_3$, PbO, ZnO, $Al_2O_3$, etc. If the insulative planar coil is made of a mixture of the magnetically permeating material and the non-magnetically permeating material, its magnetic conductivity can be adjusted to vary between 1 and that of the magnetic main body.

Figure 5:
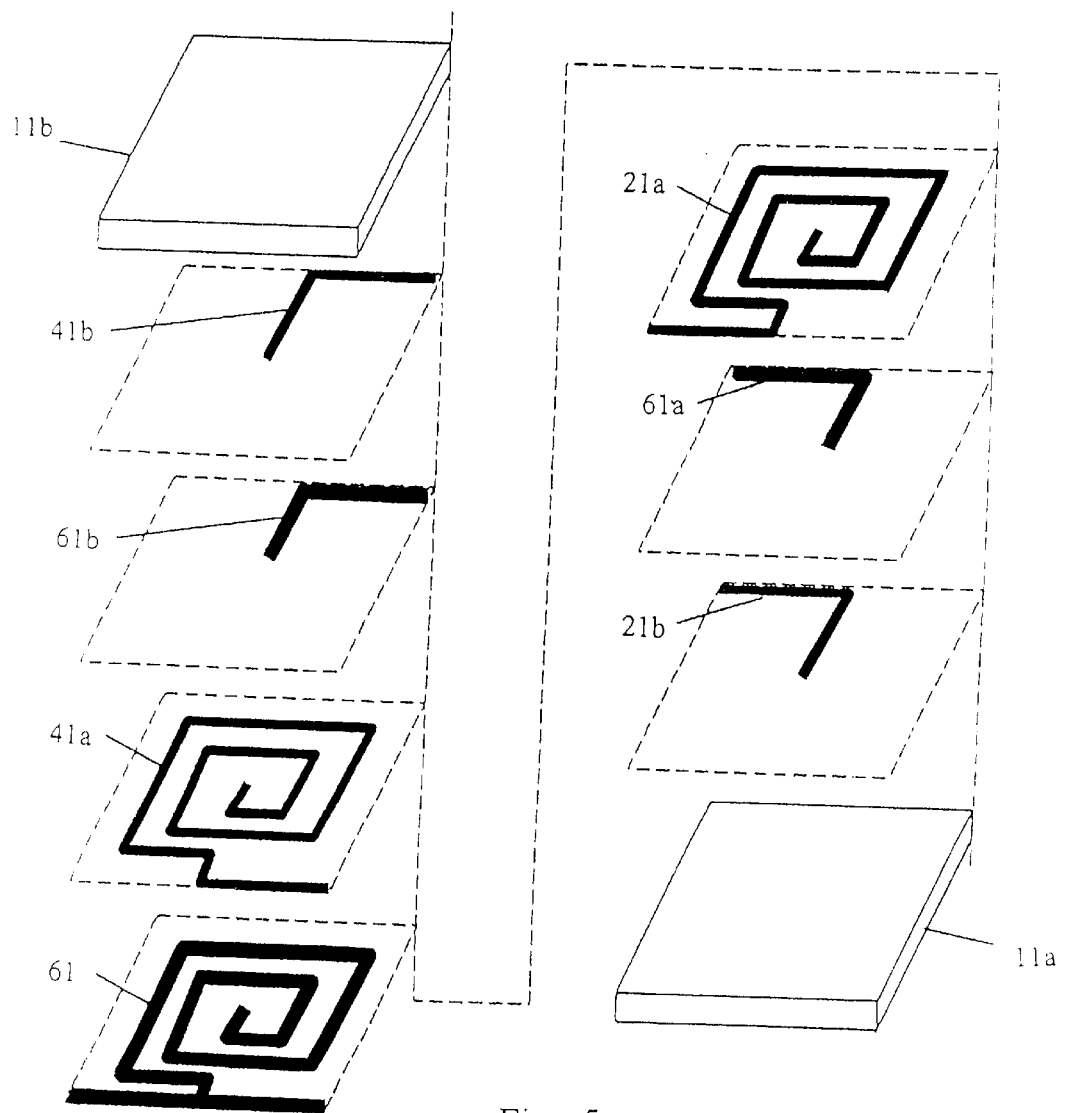
FIG. 5 is an illustrative perspective layer-by-layer view of the chip-type common mode filter according the second preferred embodiment of the present invention wherein a separate planar coil segment is provided as an input terminal (or output terminal) to the electrically conductive planar coil.

FIG. 5 is an illustrative perspective layer-by-layer view of the chip-type common mode filter according the second preferred embodiment of the present invention wherein a separate planar coil segment is provided as an input terminal (or output terminal) to the electrically conductive planar coil. FIG. 5 also provides an illustration of how the common mode filter of the present invention is put together.

Similar to the first embodiment as shown in FIG. 3, the common mode filter according to the second embodiment comprises a first conductive planar coil 41a, a second conductive planar coil 21a, and an insulative planar coil 61 sandwiched between the two conductive planar coils 41a and 21a. However, unlike the first embodiment, FIG. 5 shows that the input (or output) terminals to the conductive planar coils are provided with separate conductive planar coil segments 41b and 21b, which are separated from the conductive planar coils 41a and 21 a, respectively by insulative planar coil segment 61b and 61 a, except at their inner end portions which are pressed against and are in contact with the conductive planar coils to provide the necessary electric connection.

Using a thick-film process as an example, FIG. 5 also shows top and bottom magnetic green sheets 11b and 11a, which will be grown into each other by lamination and sintering so as to completely bury the filter coils. During the fabrication of the filter, all the components, including the first conductive planar coil segment 21b, first insulative planar coil segment 61a, first conductive planar coil 21a, insulative planar coil 61, second conductive planar coil 41a, second insulative planar coil segment 61b, and second conductive planar coil segment 41b are formed, by printing, on the bottom magnetic green sheet 11a. Finally the top magnetic green sheet 11b is placed covering the entire coil stack. Alternately, the first coils and coil segments and insulative coils and coil segments 21b, 61a, 21a, 61 can be formed on the bottom magnetic green sheet and the second coils and coil segments 41b, 61b, 41a on the top magnetic green sheet, and the two magnetic green sheets are then stacked together facing each other to bury the coils. The magnetic green sheets are then sintered to generate close-looped magnetic fields around the coil stacks. A plurality of magnetic green sheets can be used in the top and bottom layers so as to build up the necessary thickness and magnetic field strength.

FIG. 6 is an illustrative perspective layer-by-layer view of the chip-type common mode filter similar to the second preferred embodiment as shown in FIG. 5, except that the bent portions of the conductive coils 23a, 43a, and coil segments 23b, 43b, are formed at a slanting angle (about 45 degrees), and the insulative planar coil segments 63a, 63b, have a widened width 64a, 64b, along the edge of the magnetic main body so as to eliminate the possibility of circuit shorting.

A plurality of the common mode filter circuits can be connected in series. In the simplest series construction, two stacks of the coils (conductive-insulative-conductive planar coils) are further stacked on top of each other, but are separated by a partitioning magnetic layer. The conductive planar coils in one stack are respectively connected to the conductive planar coils in the other stack by a pair of conductive holes (or vias) that are formed through the partitioning magnetic layer. These cause two individual common mode filter circuits to be connected in series. Additional filter circuits can be further connected to form multiple common mode circuits.

Figure 8:
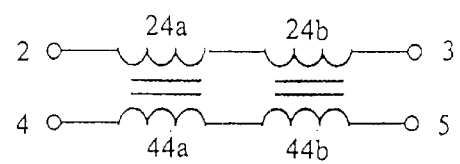
FIG. 8 is an illustrative equivalent electric diagram of the serially connected filer coils as shown in FIG. 7.
Figure 7:
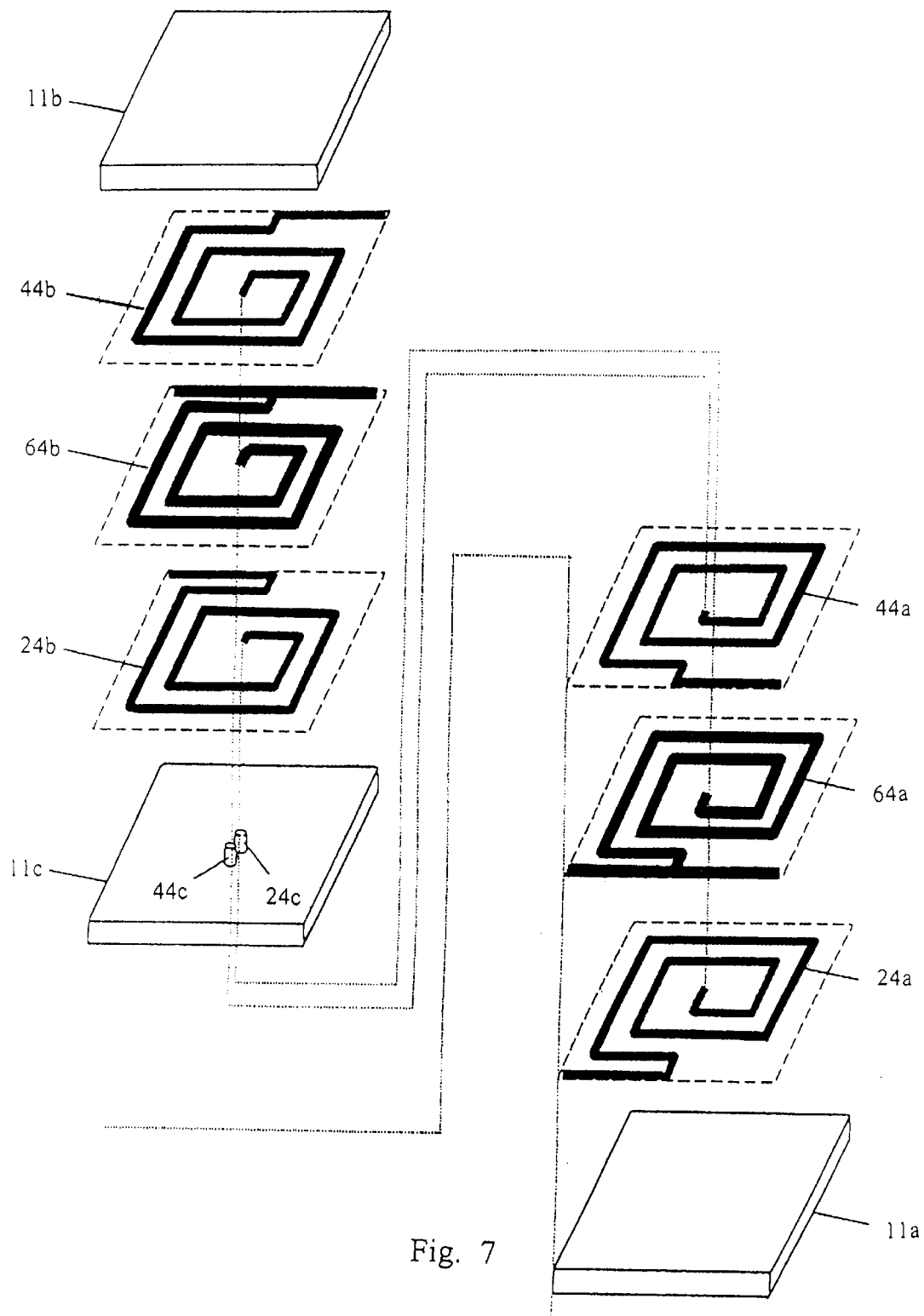
FIG. 7 is an illustrative perspective layer-by-layer view of the chip-type common mode filter according the first preferred embodiment of the present invention wherein a pair of individual coil stacks are connected in series via a pair of electrically conductive cores that are formed through a partitioning magnetic layer.

FIG. 7 is an illustrative perspective layer-by-layer view of the chip-type common mode filter according the first preferred embodiment of the present invention wherein a pair of individual coil stacks 44b, 64b, 24b, and 44a, 64a, 24a are connected in series by a pair of electrically conductive holes 44c and 24c that are formed through a partitioning magnetic layer. FIG. 7 shows that the first conductive planar coil 44b is connected to the third conductive planar coil 44a by first conductive core 44c, and the second conductive planar coil 24b is connected to the fourth conductive planar coil 24a by first conductive hole 24c. FIG. 8 shows an illustrative circuitry for the serially connected filter.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

A number of chip-type common mode EMI filters were modeled which had a configuration similar to the embodiment shown in FIG. 6 (each planar coil contained two loops). Each filter has an external physical dimension of 4.5 mm×4.5 mm×1.0 mm. The magnetic main body of the filter has a magnetic permeability of 500. The conductive planar coils have an overall dimension of 3.3 mm×3.3 mm, a line width of 0.3 mm, and a thickness of 10 $\mu$m. The insulative planar coil has a line thickness of 0.45 mm, and a thickness of 10 $\mu$m and permeability designated as $\mu 2$. The values of inductances of the two conductive coils L1 and L2, mutual inductance M, common mode inductance Lc, normal mode inductance Ln, and the ratio of common mode inductance over normal mode inductance Lc/Ln, were calculated for the different values of $\mu 2$, and are summarized in Table 1 below

TABLE I

| $\mu 2$ | L1 ($\mu$H) | L2 ($\mu$H) | M ($\mu$H) | Lc ($\mu$H) | Ln ($\mu$H) | Lc/Ln |
|---|---|---|---|---|---|---|
| 1 | 0.600 | 0.6210 | 0.598 | 0.600 | 0.024 | 24.9 |
| 2 | 0.61159 | 0.64746 | 0.60756 | 0.611 | 0.044 | 13.9 |
| 5 | 0.64454 | 0.71457 | 0.63335 | 0.643 | 0.092 | 7.0 |
| 10 | 0.69112 | 0.79978 | 0.66757 | 0.688 | 0.156 | 4.4 |
| 100 | 1.101397 | 1.24108 | 0.8488 | 0.965 | 0.557 | 1.7 |
| 500 | 1.30348 | 1.5383 | 0.93935 | 1.166 | 0.963 | 1.2 |

FIG. 9 shows a plot of Lc/Ln over a range of $\mu 2$ from 1 to 500. From Table 1 and FIG. 9, it can be derived by interpolation that when $\mu 2$ is less than 8, the ratio of Lc/Ln can be maintained above 5. To obtain a filter having Lc/Ln greater than 3, then the value of $\mu 2$ must be increased to within 20

EXAMPLE 2

A chip-type common mode EMI filter was prepared using a thick-film multi-layer manufacturing process which was very similar in configuration to those in Example 1, except that the chip has a thickness of 0.7 mm and the magnetic main body has a magnetic permeability of 120. The insulative planar coil has a magnetic permeability of about 10. Normal mode and common mode impedances were measured over a frequency range from 1 MHz to 1,000 MHz. The results are plotted in FIG. 10. At 100 MHz, a ratio of common mode impedance over normal mode impedance Zc/Zn of 10 can be obtained.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A common mode EMI filter comprising:

(a) a magnetic main body;

(b) a pair of stacked but spaced apart electrically conductive planar coils embedded in said magnetic main body, said conductive planar coils having an identical pattern; and (c) an electrically non-conductive planar coil sandwiched between said pair of conductive planar coils, wherein said non-conductive planar coil has a pattern that is identical to the pattern of said conductive planar coils so as to insulate said pair of conductive planar coils from each other, said non-conductive planar coil having a width that is equal to or greater than the width of said conductive planar coils.

2. The common mode EMI filter according to claim 1 which comprises first pair of terminals and second pair of terminals to serve as input and output for the pair of conductive planar coils, respectively.

3. The common mode EMI filter according to claim 1 which comprises first pair of terminals and second pair of terminals to serve as input and output for the pair of conductive planar coils, respectively, and wherein said terminals are coplanar extensions of said conductive planar coils.

4. The common mode EMI filter according to claim 1 which comprises first pair of terminals and second pair of terminals to serve as input and output for the pair of conductive planar coils, respectively, and wherein one of said terminals is a separate electrically conductive planar segment which is parallel to said conductive planar coils and is separated from said conductive planar coil by a non-conductive planar segment but is connected to said conductive planar coil at a common end.

5. The common mode EMI filter according to claim 4 wherein said non-conductive planar segment has an outer edge portion that is wider than the width of said conductive planar coil and said conductive planar segment.

6. The common mode EMI filter according to claim 1 wherein said conductive planar coil has a multiple-loop pattern.

7. The common mode EMI filter according to claim 1 wherein said conductive planar coil has a meandering pattern.

8. The common mode EMI filter according to claim 1 wherein said conductive planar coil has a multiple-loop spiral pattern.

9. The common mode EMI filter according to claim 1 wherein said non-conductive planar coil has a magnetic permeability between 1 and a magnetic permeability of said magnetic main body.

10. The common mode EMI filter according to claim 1 wherein said magnetic main body comprises ferrite containing at least a compound selected from the group consisting of $Fe_2O_3$, NiO, CuO, ZnO, $MnO_2$, and CoO.

11. The common mode EMI filter according to claim 1 wherein said non-conductive planar coil contains a non-magnetic material containing at least one compound selected from the group consisting of MgO, $SiO_2$, $B_2O_3$, PbO, ZnO, and $Al_2O_3$.

12. A common mode EMI filter comprising a plurality of common mode EMI filter units connected in series, each of said common mode EMI filter units comprises:

(a) a magnetic main body;

(b) a pair of identical electrically conductive planar coils embedded in said magnetic main body;

(c) an electrically non-conductive planar coil sandwiched between said pair of conductive planar coils, wherein said non-conductive planar coil has a pattern that is identical to the pattern of said conductive planar coils so as to insulate said pair of electrically conductive planar coils from each other;

(d) wherein two adjacent said common mode EMI filter units are separated by a magnetic partitioning layer, and said pair of conductive planar coils of one common mode EMI filter units are respectively connected another pair of electrically conductive planar coils of another common mode EMI filter units by a pair of electrically conductive vias formed through said magnetically partitioning layer.

* * * * *